(12) United States Patent
Ju et al.

(10) Patent No.: US 7,404,721 B2
(45) Date of Patent: Jul. 29, 2008

(54) ELECTRICAL CONNECTOR ASSEMBLY

(75) Inventors: Ted Ju, Keelung (TW); Chien Chih Ho, Keelung (TW)

(73) Assignee: Lotes Co., Ltd., Keelung (TW)

( * ) Notice: Subject to any disclaimer, the term of this patent is extended or adjusted under 35 U.S.C. 154(b) by 0 days.

(21) Appl. No.: 11/641,866

(22) Filed: Dec. 20, 2006

(65) Prior Publication Data
US 2008/0153323 A1 Jun. 26, 2008

(51) Int. Cl.
*H01R 13/44* (2006.01)
(52) U.S. Cl. .................................................. 439/135
(58) Field of Classification Search ................. 439/135, 439/940, 151
See application file for complete search history.

(56) References Cited
U.S. PATENT DOCUMENTS 6,945,799 B2 * 9/2005 Huang ........................ 439/135
7,029,295 B2 * 4/2006 Liao ........................... 439/135
7,140,890 B1 * 11/2006 Ju ............................... 439/135

* cited by examiner

Primary Examiner—Phuong K Dinh
(74) Attorney, Agent, or Firm—Rosenberg, Klein & Lee

(57) ABSTRACT

An electrical connector socket includes an electrical connector and a pick-up cap assembled on the electrical connector according to the present invention is used for connecting chip module on a circuit board. The electrical connector includes a main body having an insulated body and a plurality of terminals electrically connected with the chip module and mounted inside the insulated body, and a metal clip assembled with the main body for pressing the chip module on the terminal. The pick-up cap is disposed on the main body and basically is above the metal clip. There is no need to design a new pick-up cap. Therefore, the design and development cost are reduced and such pick-up cap is more universal.

19 Claims, 17 Drawing Sheets

US 7,404,721 B2

ELECTRICAL CONNECTOR ASSEMBLY

BACKGROUND OF THE INVENTION

The present invention relates to an electrical connector assembly, especially to an electrical connector assembly with a pick-up cap.

The electrical connector assembly for connecting chip module on a circuit board is generally formed by a metal base, a metal clip, a lever and an insulated body mounted with a plurality of conductive terminals. The metal base is a rectangular frame with the insulated body therein. Through conductive terminals inside the insulated body (or solder ball under conductive terminals), the metal base is welded on the circuit board. Due to high temperature of welding, the electrical connector is placed onto the circuit board by vacuum adsorption, in the meantime, ensure each of the conductive terminals (or solder balls) align with corresponding holes or solder pads on the circuit board, so as to weld the electrical connector onto the circuit board. Generally, there is no flat surface with sufficient area on the electrical connector for placing the nozzle of the vacuum adsorption device, in such a manner, a pick-up cap with sufficient flat surface arranged on a metal cap is additional added on the electrical connector. However, the pick-up cap is arranged on the metal cap. Once the design of the metal cap is changed, the pick-up cap may not align with the metal cap any more, in such circumstance, a new adsorption cover is required, and this will increase the manufacturing cost.

Thus there is a need to design a new type electrical connector for overcoming above shortages.

SUMMARY OF THE INVENTION

Therefore it is a primary object of the present invention to provide an electrical connector assembly at lower cost.

In order to achieve the object, an electrical connector assembly for connecting chip module on a circuit board according to the present invention consists of an electrical connector and a pick-up cap assembled on the electrical connector. The electrical connector includes a main body having an insulated body and a plurality of terminals electrically connected with the chip module and mounted inside the insulated body, and a metal clip assembled with the main body for pressing the chip module on the terminal. The pick-up cap is disposed on the main body and basically is above the metal clip.

Compared with current technology, the pick-up cap of the electrical connector assembly according to the present invention is disposed on the main body and basically is above the metal clip, but neither end of the pick-up cap is fixed on the metal clip of the electrical connector so that even the structure of the metal clip is changed a bit, the pick-up cap can still be assembled with the metal clip for being used, and there is no need to design a new pick-up cap. Therefore, the design and development cost are reduced and such kind of pick-up cap is more universal.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENT

Figure 1:
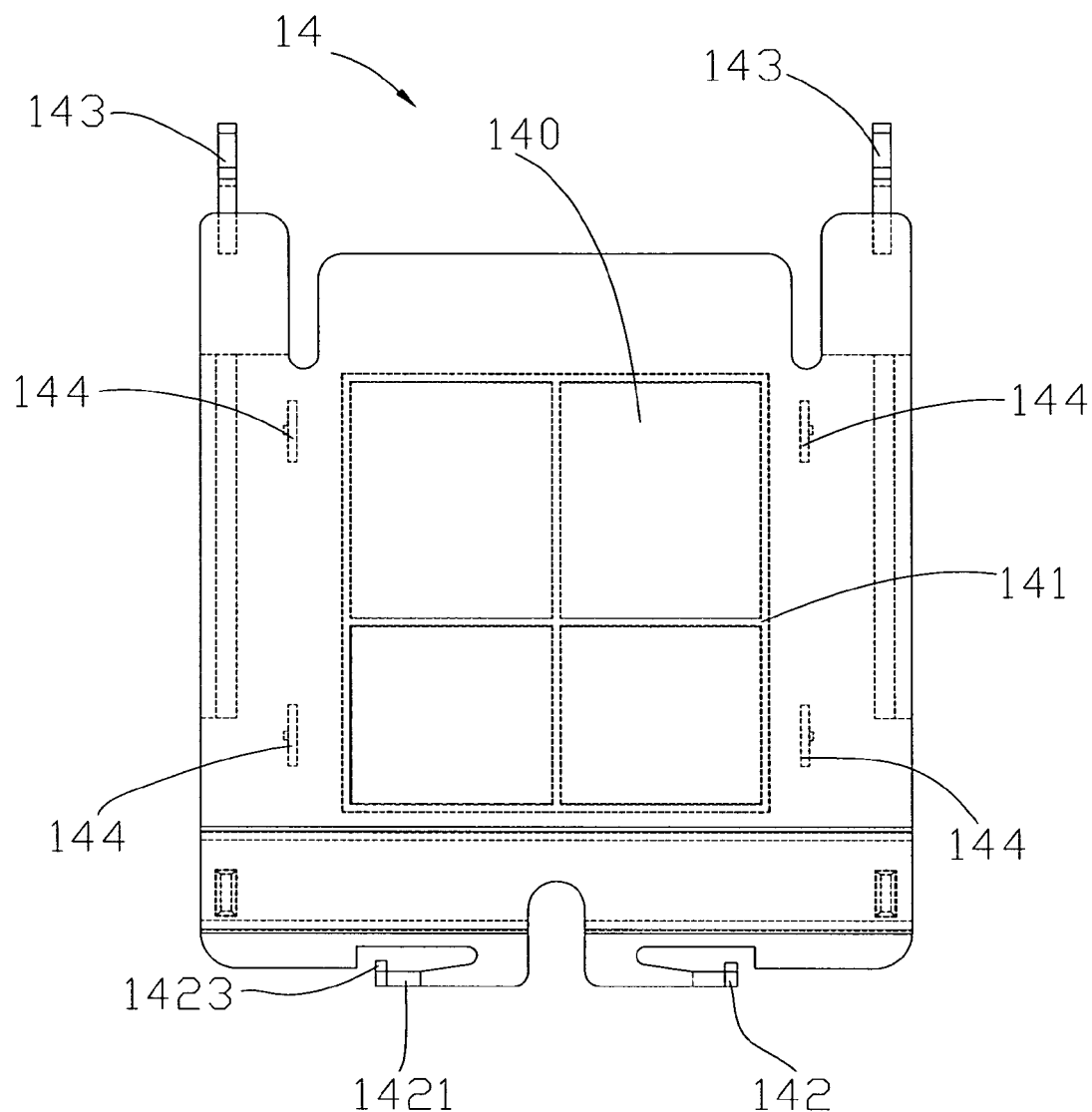
FIG. 1 is a top view of a pick-up cap of an electrical connector assembly according to the present invention.
Figure 2:
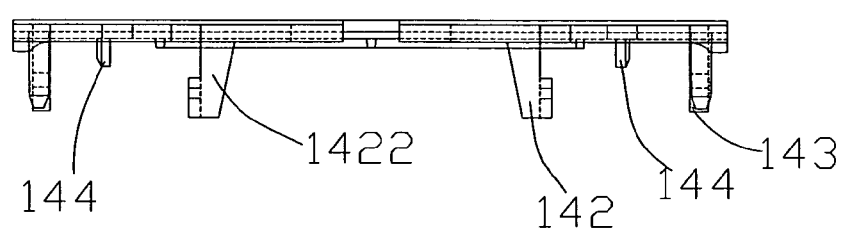
FIG. 2 is a side elevation view of the electrical connector assembly of FIG. 1.
Figure 3:
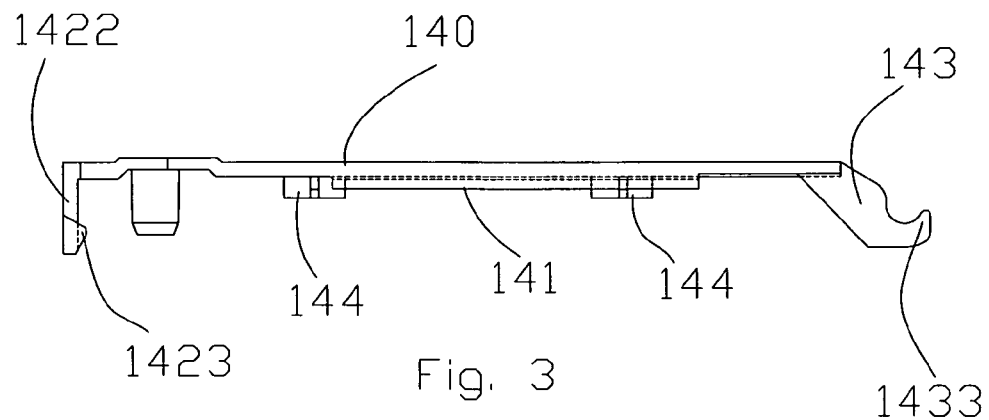
FIG. 3 is a side elevation view of the pick-up cap of the electrical connector assembly of FIG. 1.
Figure 4:
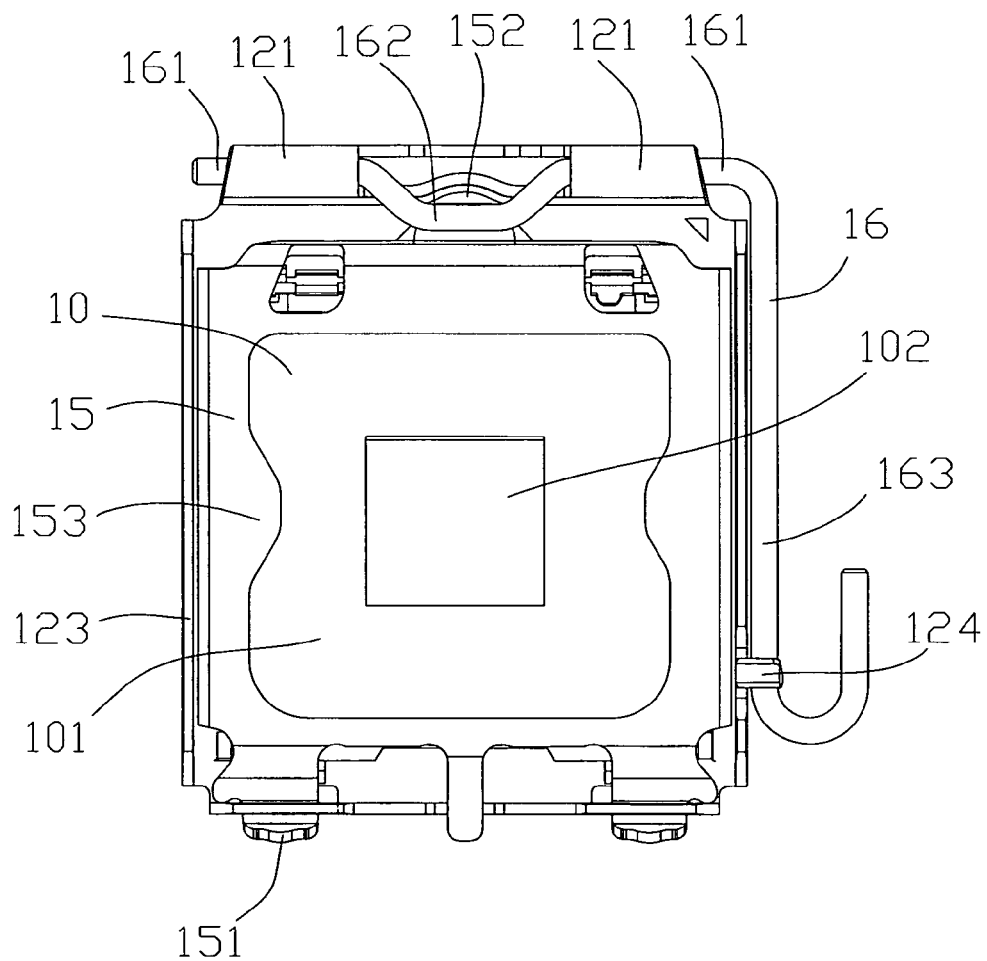
FIG. 4 is a top view of the electrical connector assembly according to the present invention.
Figure 5:
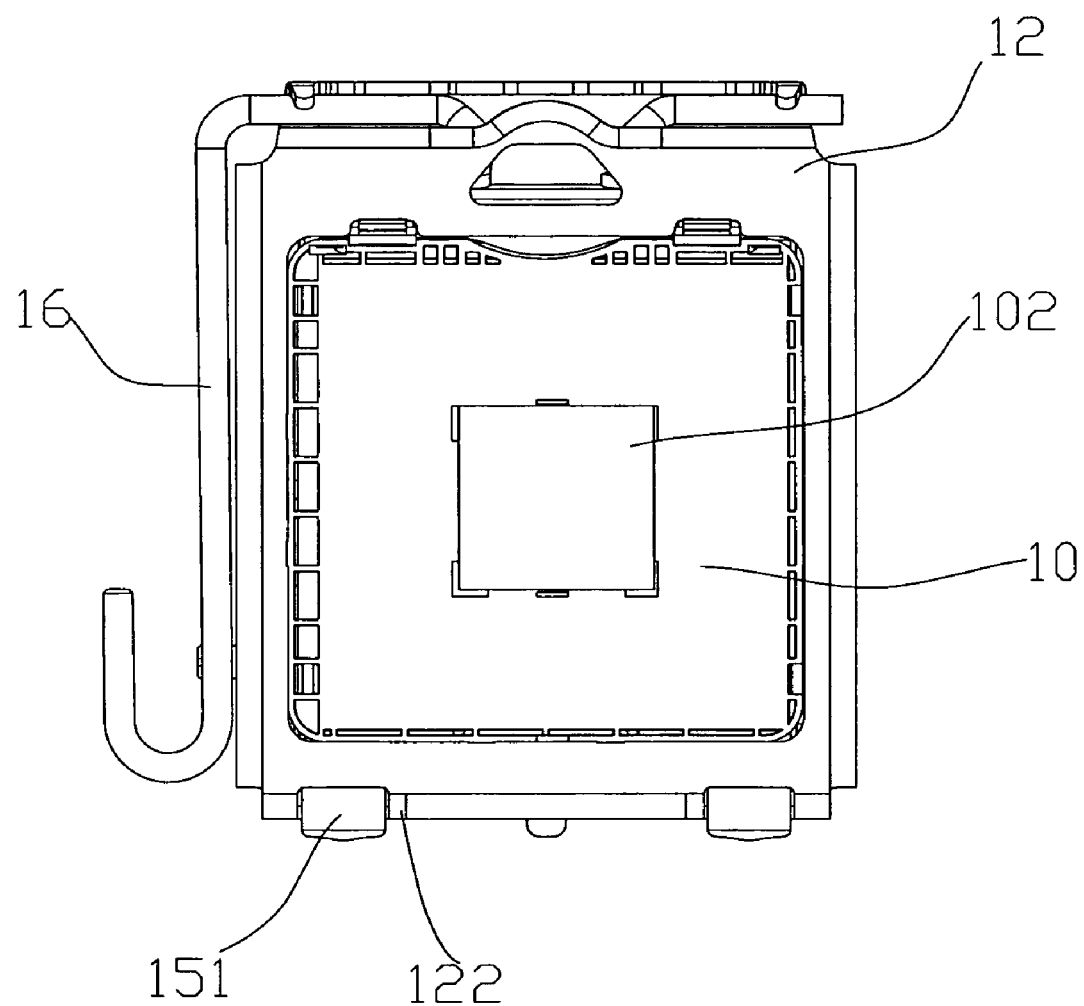
FIG. 5 is a bottom view of the embodiment of FIG. 4.
Figure 6:
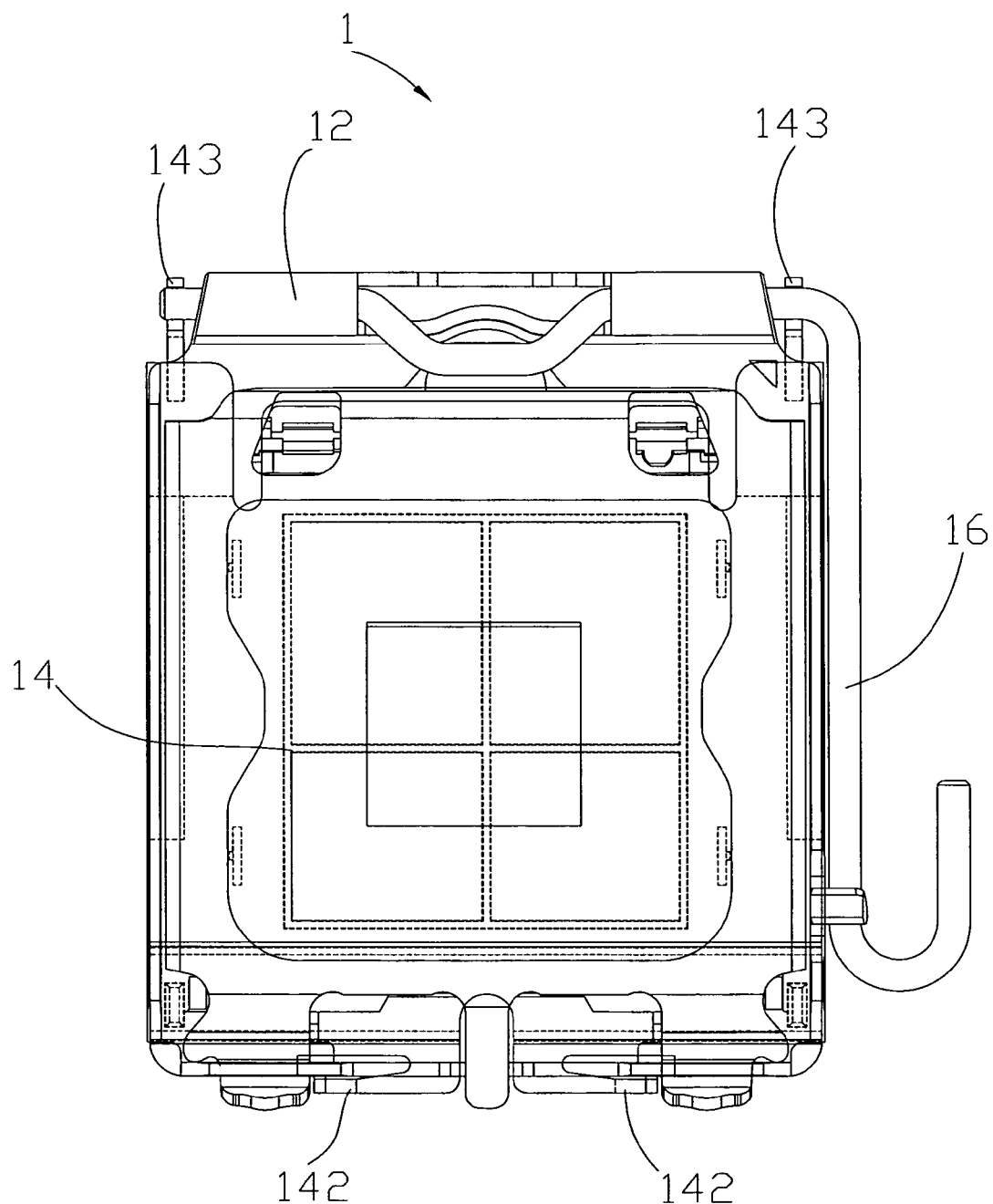
FIG. 6 is an assembly view of the pick-up cap of the electrical connector assembly of FIG. 4.
Figure 7:
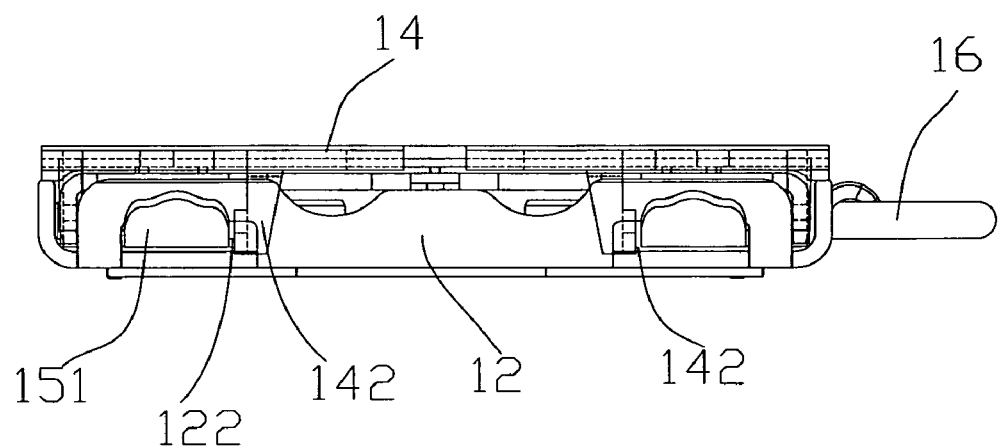
FIG. 7 is a side elevation view of the embodiment of FIG. 6.
Figure 8:
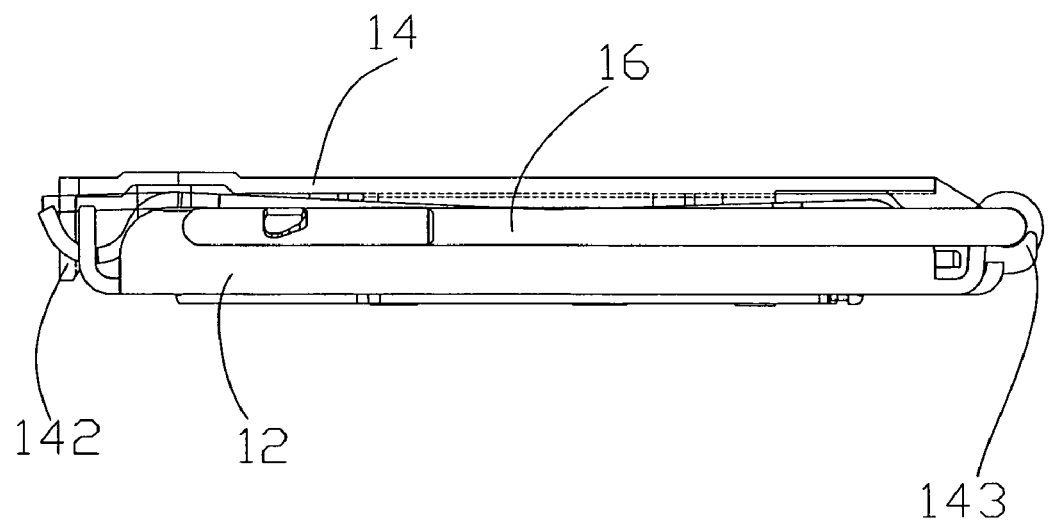
FIG. 8 is a right side view of the embodiment of FIG. 6.

Referring from FIG. 1 to FIG. 8, an electrical connecting assembly for connecting a chip module (not shown in figure) on a circuit board according to the present invention consists of an electrical connector 1 and a pick-up cap 14 disposed thereon. The electrical connector 1 includes a main body and a metal clip 15 for fixing the chip module assembled with the main body. The main body consists of an insulated body 10 and a plurality of conductive terminals (not shown in figure) mounted inside the insulated body 10, a fastening seat 12 pivoted with the metal clip 15 for fixing the chip module on two ends thereof and a lever 16 for fastening the metal clip 15 on the fastening seat 12.

A receiving part 101 for loading the chip module with a plurality of terminal holes (not shown in figure) for receiving conductive terminals (not shown in figure) is disposed on the insulated body 10. A rectangular hole 102 is arranged on center of the insulated body 10.

The fastening seat 12 is a metal frame for mounting the insulated body 1 therein. A holding part 121 bending outwards from one end of the fastening seat 12 is for pivoting the lever 16 with the insulated body 10. A rotating hole 122 removably connected with the metal clip 15 is disposed on the other end of the fastening seat 12, corresponding to the holding part 121. The width of the rotating hole 122 is larger than that of a cap connecting thereof. A stopping wall 123 is installed on another two sides of the fastening seat 12 while one of the stopping walls 123 is bending outwards and disposed with a locking part 14 so as to lock the lever 16.

The metal clip 15 is a frame with a through hole and is located on one end of the insulated body 10. One end of the metal clip 15 is disposed with a pivoting end 151 assembling with the rotating hole 122 while the other end of the metal clip 15 is arranged with a locking end 152 that extends outwards. When the lever 16 is closed, the locking end 152 is pressed on the fastening seat 12. The cap is arranged with a frame 153 for pressing and fixing chip module (not shown in figure) in the receiving part 101 of the insulated body 10.

The lever 16 is set on the other end of the insulated body 10, corresponding to the metal clip 15. The lever 16 includes a pivot axis having two pivoting parts 161, a pressing part 162 projecting outwards for pressing free end of the metal clip 15 and arranged on middle of the two pivoting parts 161, and an operating part 163 extends vertically from the pivot axis.

The pick-up cap 14 made from transparent or semitransparent material is assembled on the main body. The pick-up cap 14 is composed of a main body 140 with a smooth surface in the center of the top surface thereof for adsorption of a vacuum nozzle, reinforcing ribs 141 extending downwards from bottom surface of the main body 140 and cross linked to form a net for increasing strength of the pick-up cap 14 and preventing distortion. Moreover, two first hooks 142 extend in opposite direction from one end of the main body 140 of the pick-up cap 14. The first hook 142 consists of a first elastic arm 1421 extending from the main body 140 and on the same level with the main body 140, and a second elastic arm 1422 connecting vertically to the first elastic arm 1421. A first hooking part 1423 extends inwards from rear end of the second elastic arm 1422 and is locked with upper edge of the rotating hole 122 of the fastening seat 12. Two second hooks 143 extending downwards and outwards from the main body 140 are located on the other end of the pick-up cap 14, corresponding to the first hooks 142. A second hooking part 1433 on rear end of the second hook 143 is assembled with outer side of the pivoting parts 161 of the lever 16. A locating block 144 with wedge end is arranged on two sides of bottom surface of the pick-up cap 14, corresponding to edge of through holes of the cap.

The first hook 142 and the second hook 143 extending downwards from two ends of the pick-up cap 14 respectively lock with rotating hole 122 of the fastening seat 12 and the pivoting parts 161 of the lever 16 so that the pick-up cap 14 is not connected with the metal clip 15 directly. Thus even there is a change on structure of the metal clip 15 (or the electrical connector having no cap), the pick-up cap 14 can still be able to align with the new metal clip and it's more universal. Therefore, design and development costs are reduced. Moreover, position of the hooks 142, 143 on the pick-up cap 14 can be modified once there is a structure change of the metal clip 15 so as to make the pick-up cap 14 locked on corresponding position of the insulated body 10. Furthermore, the pick-up cap 14 is transparent, during welding process of the electrical connector 1 and the circuit board, the rectangular hole 102 of the insulated body 10 aligns corresponding position on the circuit board (not shown in figure) quickly so as to make pins (not shown in figure) of the electrical connector 1 inserted into welding holes (not shown in figure) of the circuit board precisely. Thus the electrical connector 1 and the circuit board are welded fast and the distortion or breaking of terminals of the electrical connector 1 caused by misalignment can be avoided.

Figure 9:
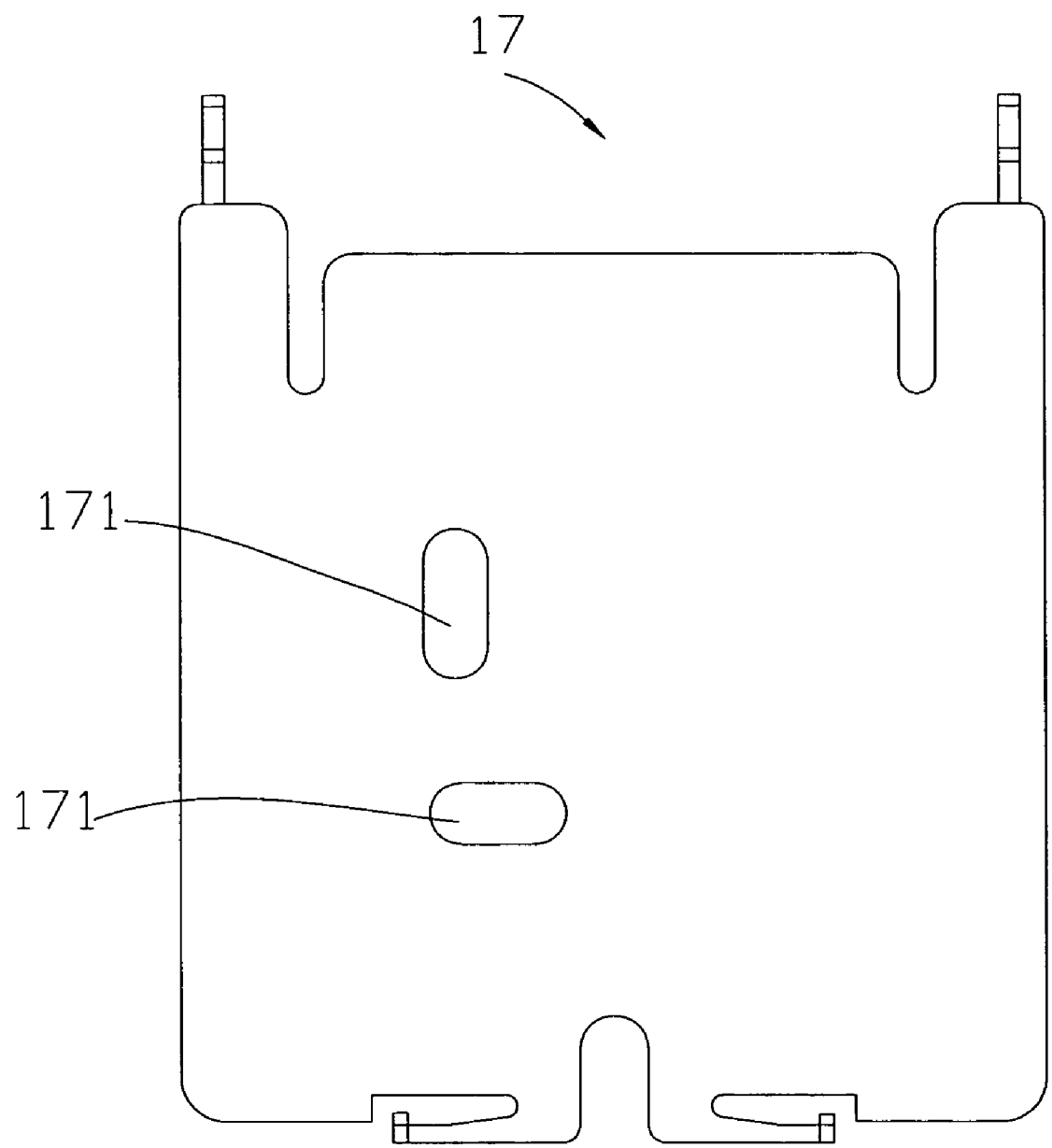
FIG. 9 is a top view of the pick-up cover of another embodiment according to the present invention.
Figure 10:
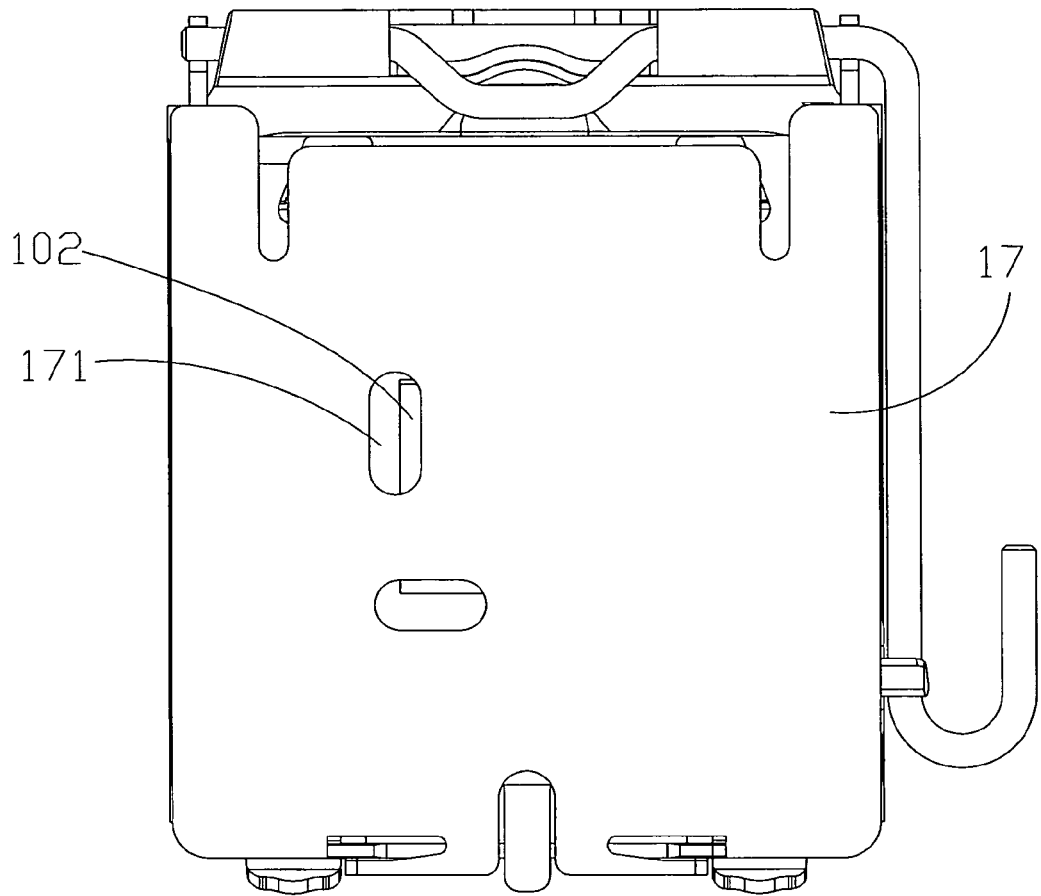
FIG. 10 is an assembly view of the electrical connector assembly of FIG. 4.
Figure 11:
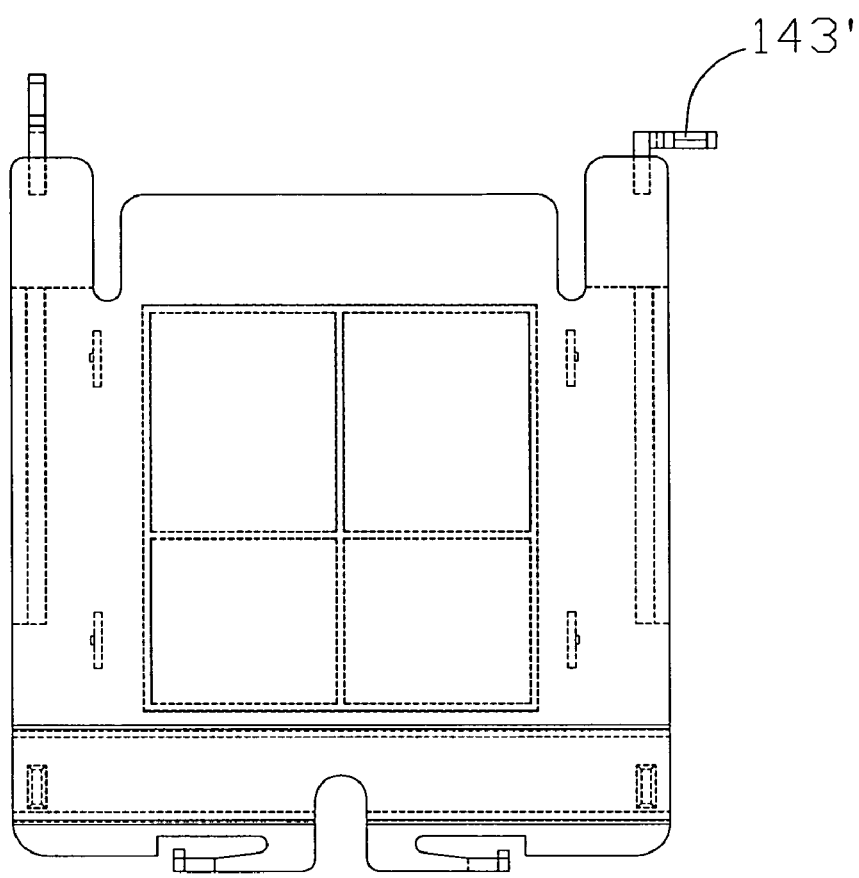
FIG. 11 is a top view of the pick-up cap of a further embodiment according to the present invention.
Figure 12:
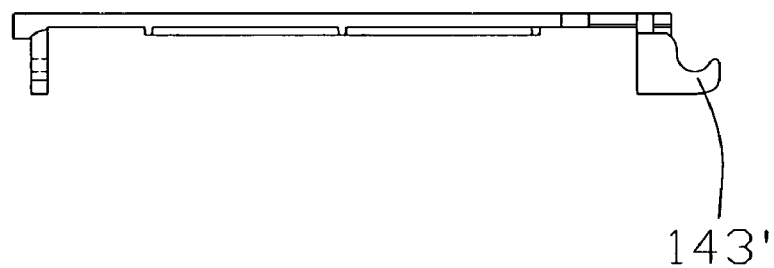
FIG. 12 is a side elevation view of the pick-up cap of FIG. 11.
Figure 13:
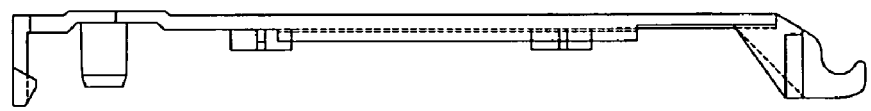
FIG. 13 is a right side view of the pick-up cap of FIG. 12.
Figure 14:
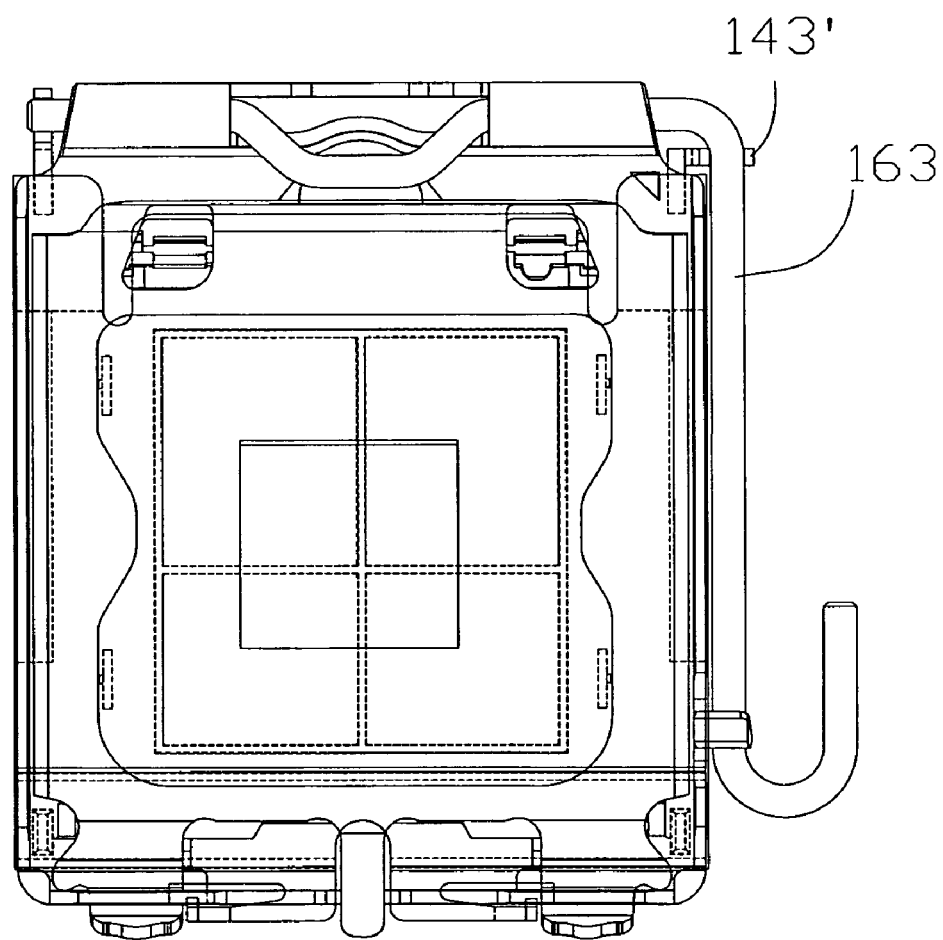
FIG. 14 is an assembly view of the electrical connector assembly of FIG. 4.
Figure 15:
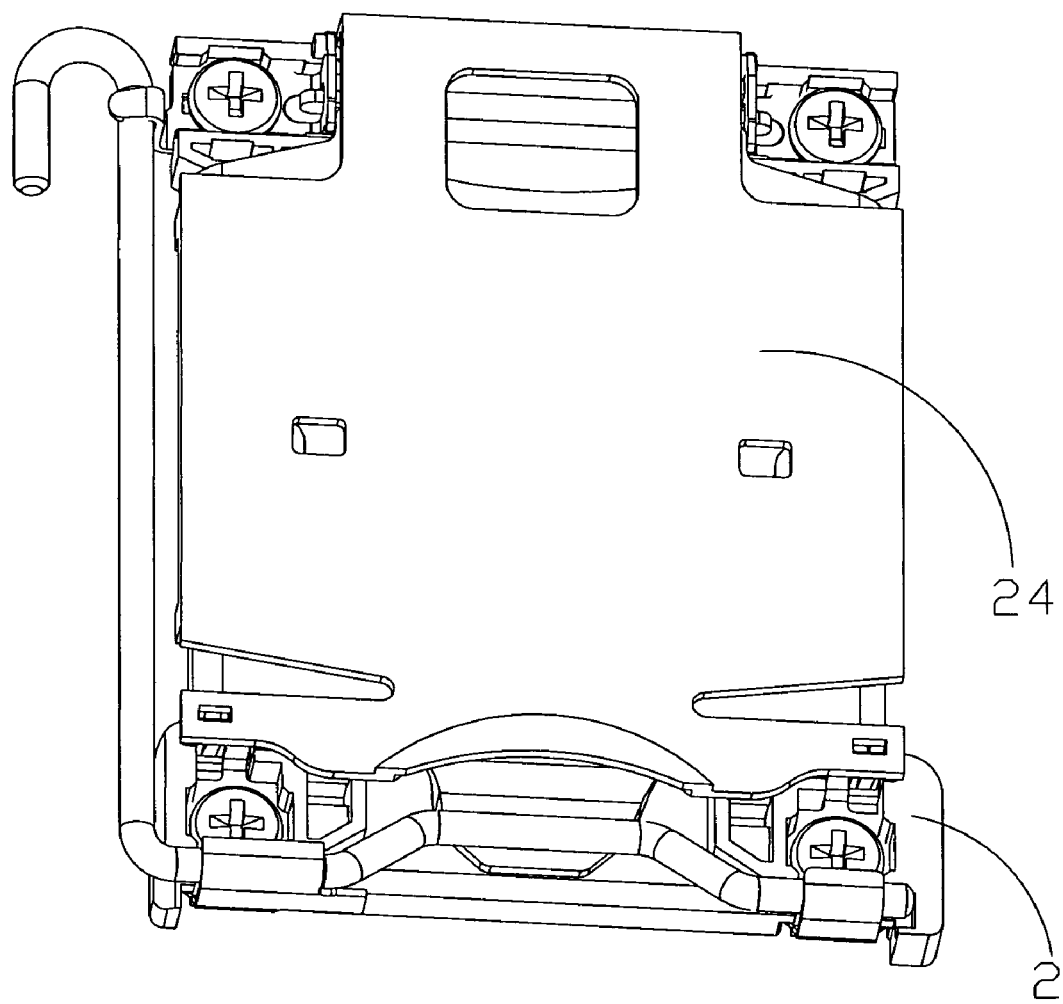
FIG. 15 is an assembly view of the pick-up cap of a further embodiment according to the present invention.
Figure 16:
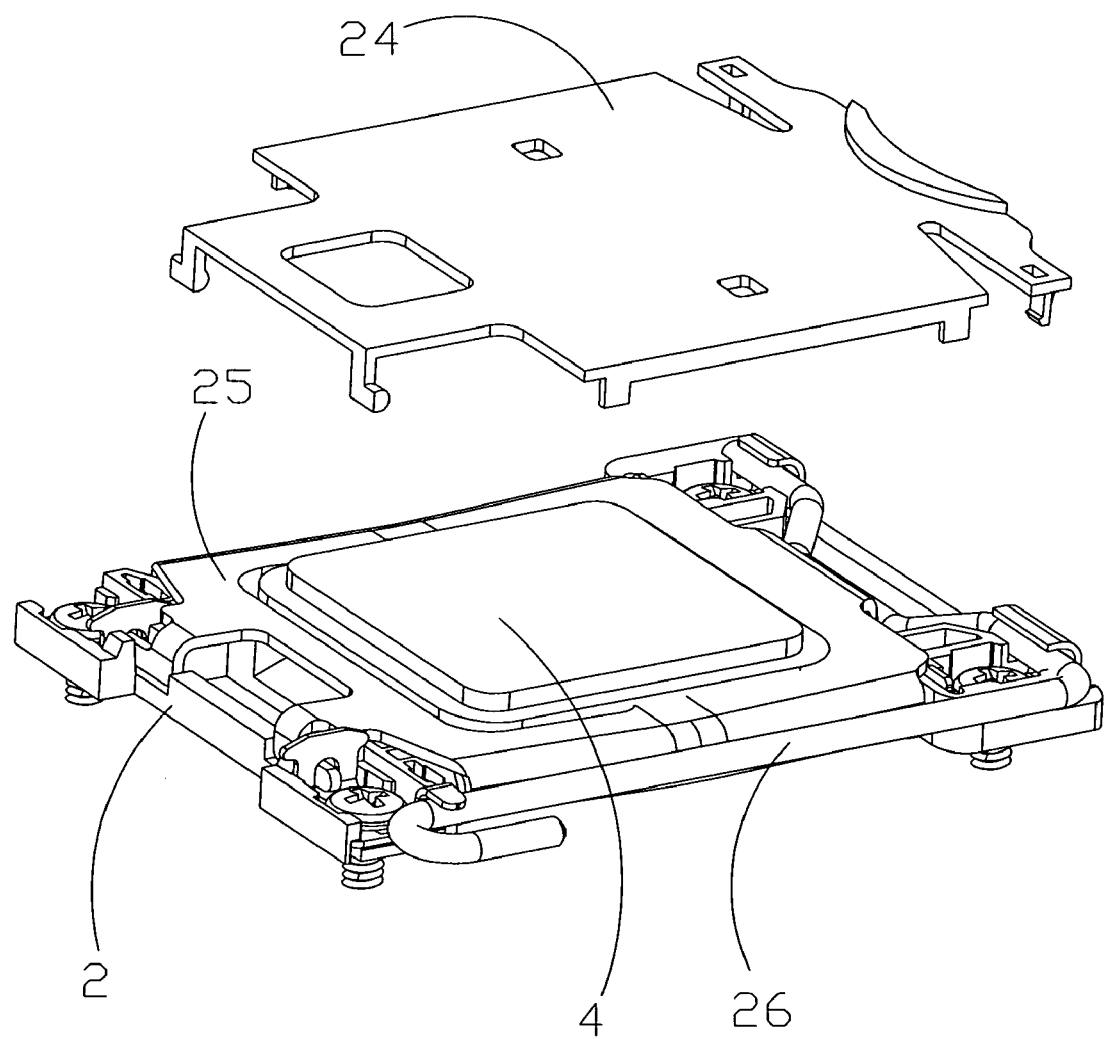
FIG. 16 is an explosive view of the pick-up cap and the electrical connector of FIG. 15.
Figure 17:
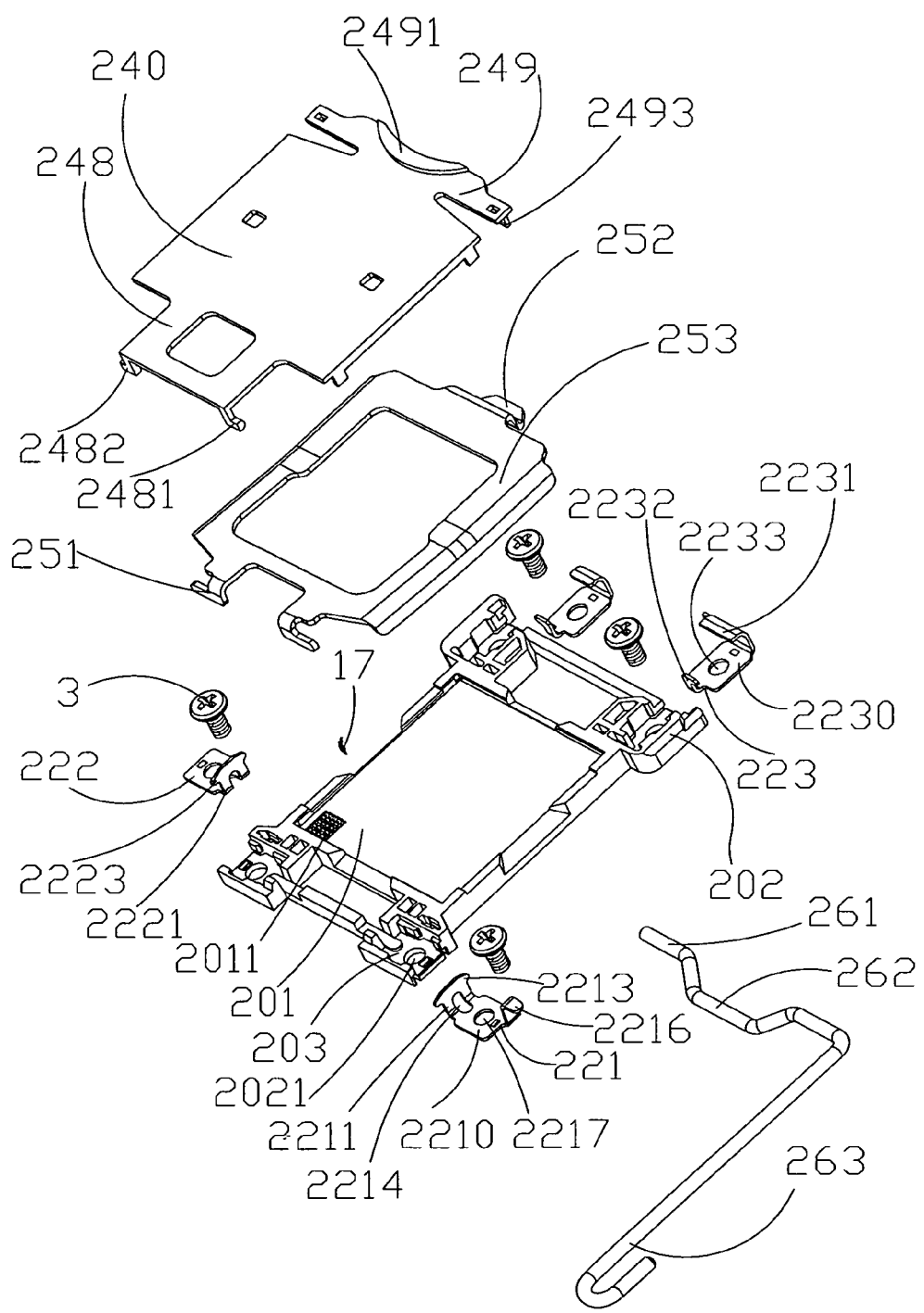
FIG. 17 is an explosive view of the electrical connector assembly of FIG. 15.
Figure 18:
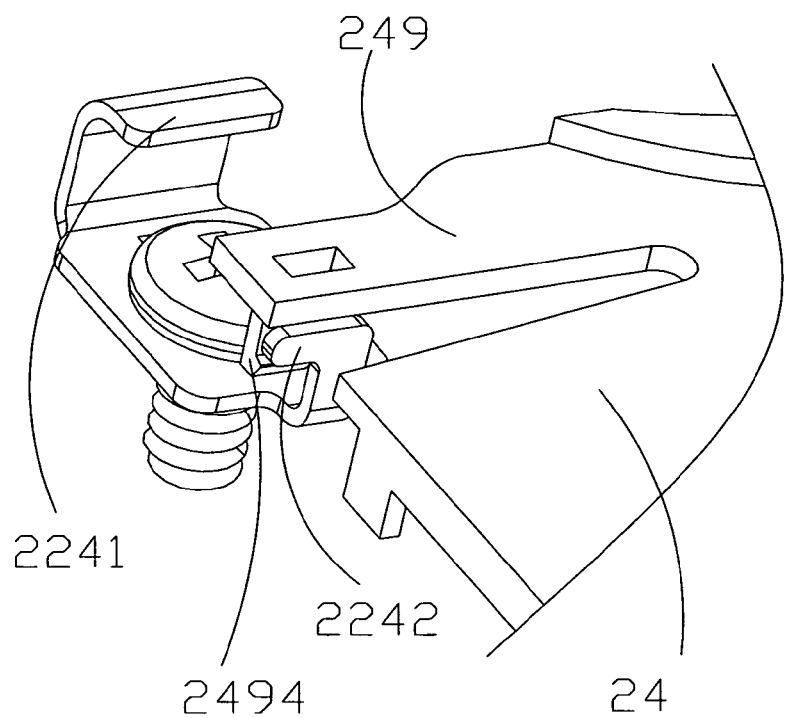
FIG. 18 is a partial enlarged view of a metal locking member on one end of the pick-up cap and the electrical connector of FIG. 15.
Figure 19:
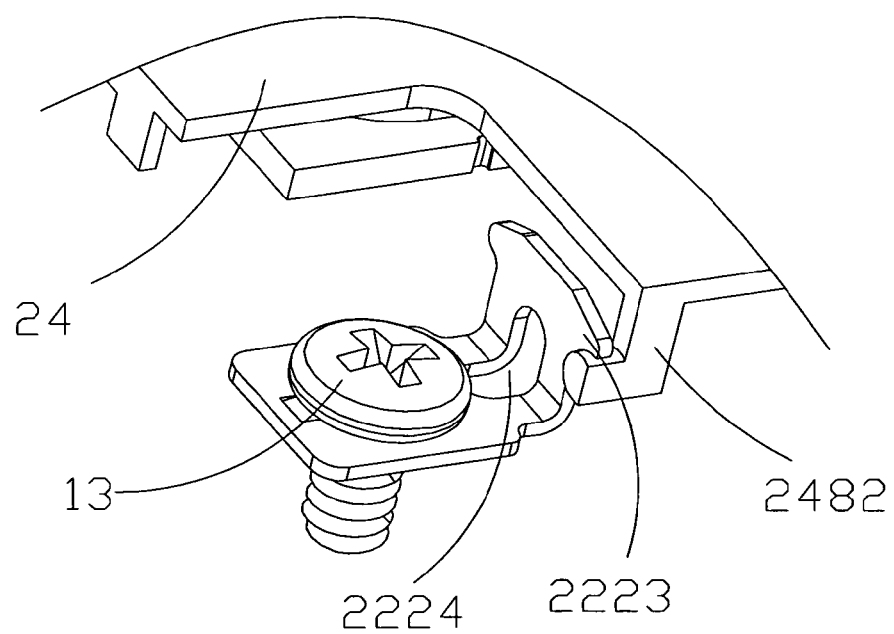
FIG. 19 is a partial enlarged view of a metal locking member on the other end of the pick-up cap and the electrical connector of FIG. 18.
Figure 20:
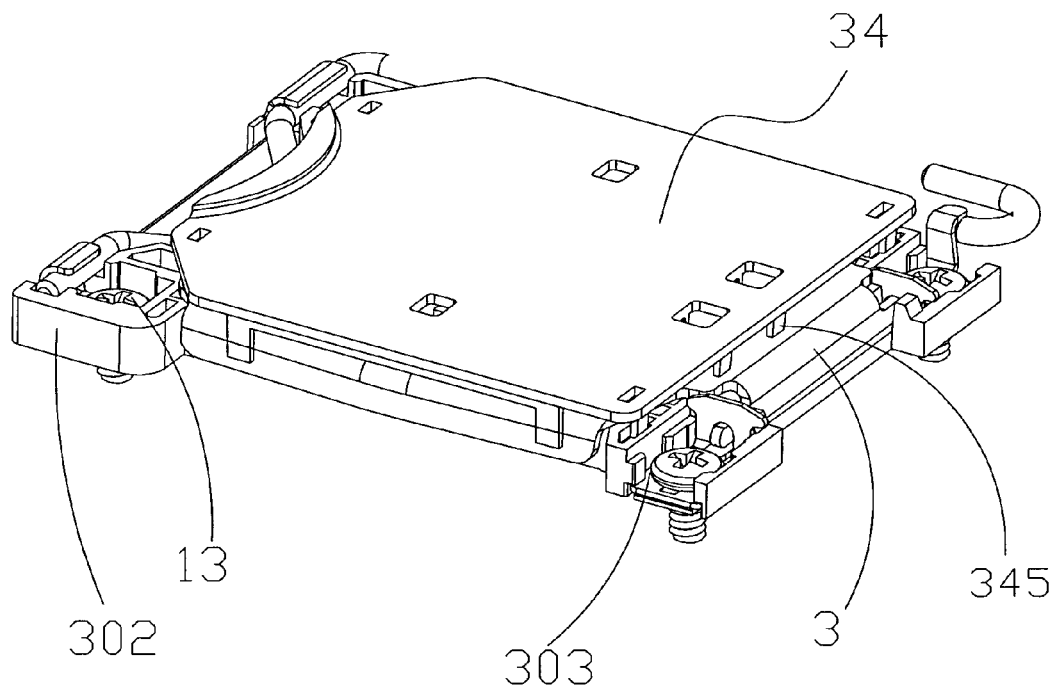
FIG. 20 is an assembling view of the pick-up cap of a further embodiment according to the present invention.
Figure 21:
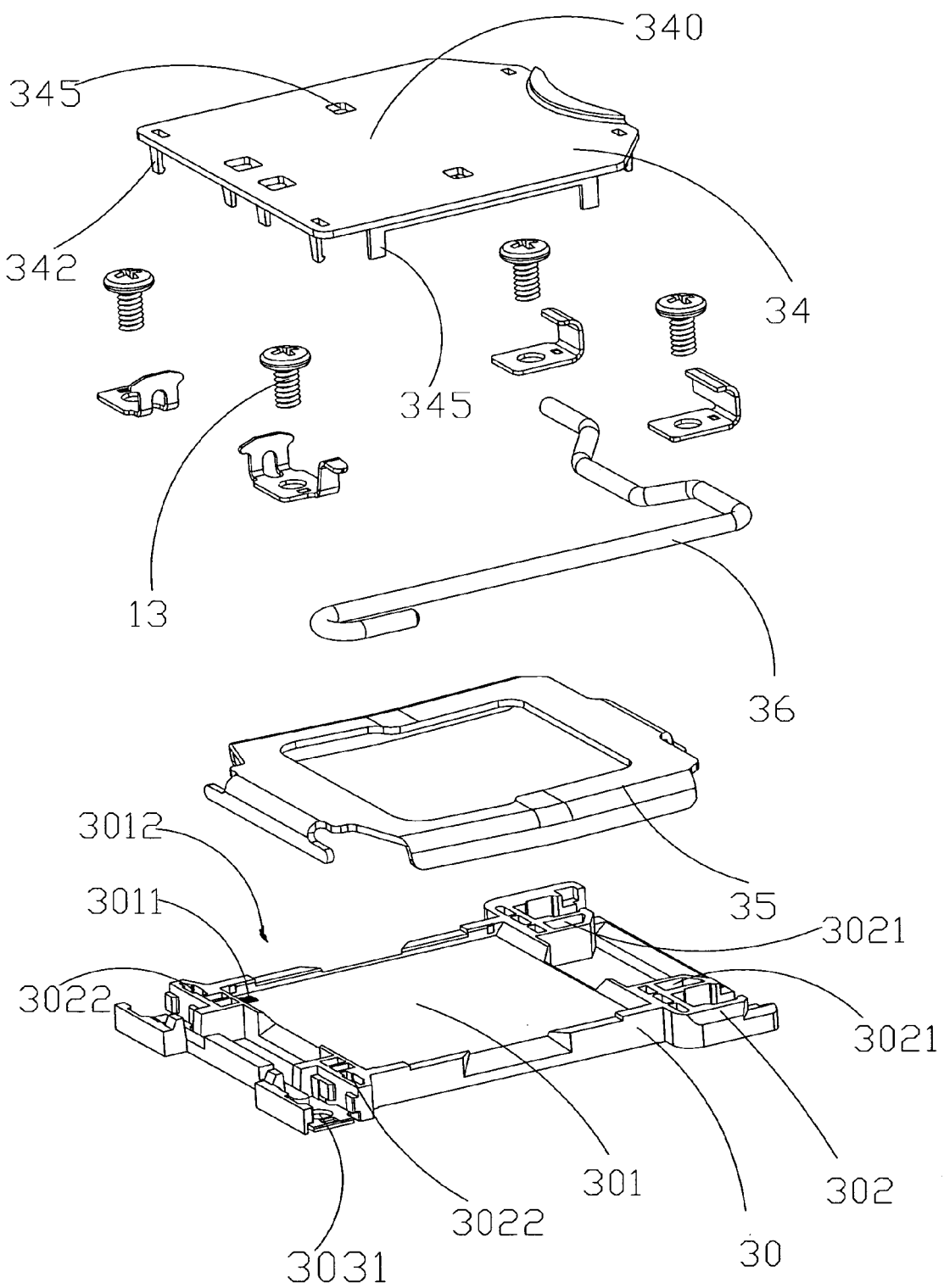
FIG. 21 is an explosive view of the electrical connector assembly of FIG. 20.
Figure 22:
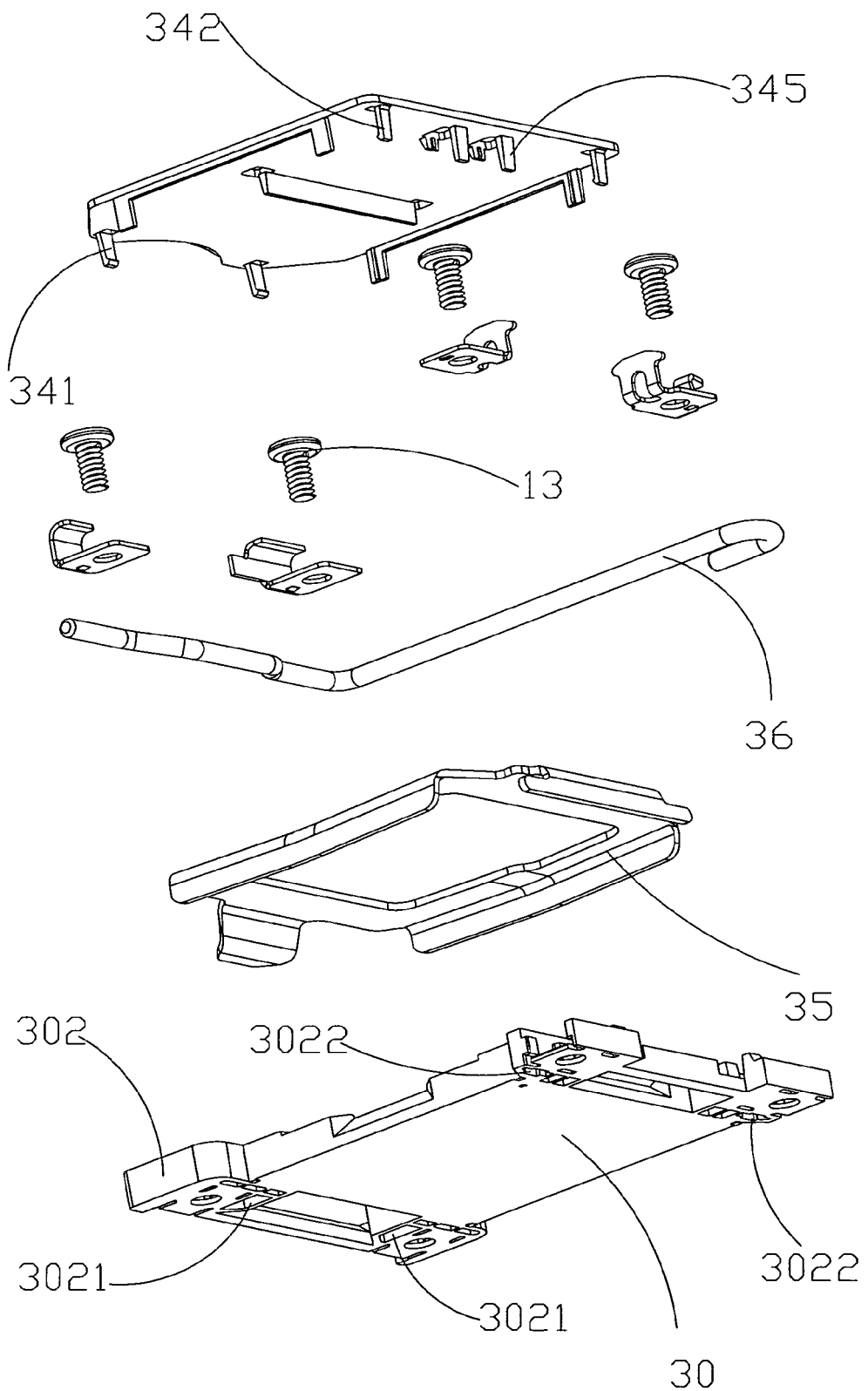
FIG. 22 is another explosive view of the electrical connector assembly of FIG. 21.
Figure 23:
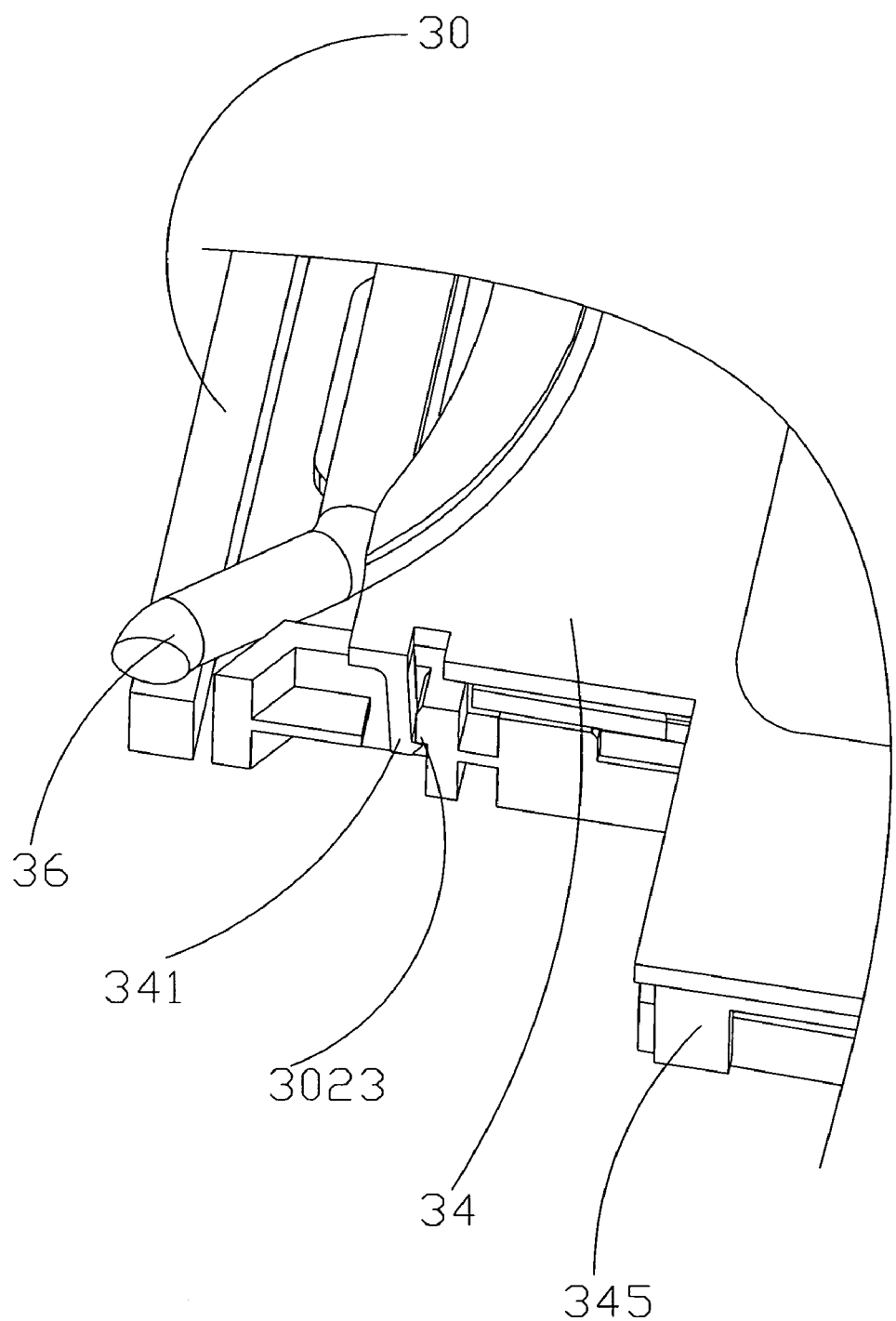
FIG. 23 is partial enlarged cross sectional view of the electrical connector assembly of FIG. 20.

Refer to FIG. 9 & FIG. 10, another embodiment of the present invention is revealed. The difference between this embodiment and above one is that the pick-up cap 17 is nontransparent. At least one hole 171 is disposed on the pick-up cover 17, so edges of the rectangular hole 102 in the center of the insulated body 10 can be seen via the hole 171. Thus this embodiment can also achieve the same objects and effects of the above embodiment.

Referring from FIG. 11 to FIG. 14, a further embodiment is disclosed. The difference between this embodiment and the first one is in that a second hook 143' extending downwards and outwards from the pick-up cover and having a second hooking part on rear end thereof. The second hook 143' is assembled with the operating part 163 of the lever 16 for fixing each other. The pick-up cap can be nontransparent. Like the second embodiment, holes are disposed on the pick-up cap so that the edges of the rectangular opening in the center of the insulated body can be seen via the hole.

Referring from FIG. 15 to FIG. 19, an electrical connector 2 of this embodiment includes a main body and a metal clip 25 connected with the main body and a lever 26 for fastening the metal clip 25. The difference between this embodiment and above embodiments is that the main body has no fastening seat but a metal frame, while a pick-up cap 24 is locked on the main body by four metal locking members on edge of an insulated body 20 of the main body.

A receiving part 201 for loading a chip module 4 with a plurality of terminal hole 2011 is disposed on the insulated body 20 for receiving conductive terminals 2012. Two projecting parts 202 with a recess 203 for receiving locking members are respectively arranged on two ends of the insulated body 20. A fastening hole 2021 is arranged in the middle part of the recess 203 of the projecting part 202 so that fastening members 3 could fix the metal locking members on the insulated body 20, and the electrical connector 2 is fastened on a circuit board (not shown in figure).

The four metal locking members are four pieces of independent metal and respectively are a first metal locking member 221, a second metal locking member 222, a third metal locking member 223, a fourth metal locking member 224. The first metal locking member 221 includes a base 2210, a holding part 2211 for fastening the pick-up cap 24 bending and extending upwards from one end of the base 2210. A protruding part 2213 for fastening the pick-up cap 24 extends from edge of the holding part 2211 while a rotating hole 2214 for pivoting the metal clip 25 is arranged on connection area between the base 2210 and the holding part 2211 while a stopping part 2216 for locating and stopping the lever 26 is arranged on the other end of the base 2210, corresponding to the holding part 2211. A through hole 2217 is disposed on middle part of the base 2210 so as to make the fastening member 3 fix the metal locking member on the insulated body 20. The second metal locking member 222 has the same structure as the first metal locking member 221 but without the stopping part and is on the other side of the insulated body 20, corresponding to the first metal locking member 221. The third metal locking member 223, and the fourth metal locking member 224 have similar structure and are located on another two corners of the insulated body 20. The third metal locking member 222 includes a base 2230, a locking part 2231 for pivoting the lever 26 bending and extending upwards from one end of the base 2230. A holding part 2232 for fastening the cover plate 24 is arranged on the other side, corresponding to the locking part 2231 while a through hole 2233 is disposed on middle part of the base 2230 so as to make the fastening member 3 fix the metal locking member on the insulated body 20.

The metal clip 25 that is a frame with a through hole on center thereof is located on one end of the insulated body 20. A pivoting end 241 for assembling with the rotating holes 2214, 2224 of the first and the second metal locking members 221, 222 are arranged on one end of the metal clip 25 while on the other end is a locking end 252 extending outwards. When the lever 26 is closed, the locking end 152 is pressed on the insulated body 20. Moreover, a frame 253 for fixing the chip set module (not shown in figure) is set on the receiving part 201 of the insulated body 20.

The lever 26 is on the other end of the insulated body 20, corresponding to the metal clip 25. The lever 26 includes an pivoting axis connecting with the locking parts 2231, 2241 of the third metal locking member 223 and the fourth metal locking member 224. The pivoting axis consists of two pivoting parts 261, a pressing part 262 between the two pivoting parts 261 and projecting inwards for fastening the locking end 252 of the metal clip 25, and an operating part 263 extending vertically from outside of the pivoting part 261 for stopping the stopping part 2216 of the first metal locking member 221.

The pick-up cap 24 is composed of a main body 240 that is a closed flat surface for adsorption of a vacuum nozzle, a rectangular through hole 245 is welded on one of the two sides of the main body 240 for heat dissipation, and an extension part 248 whose width is a bit smaller than that of the main body 240 arranged on one end of the main body 240. A first hook 2481 and a second hook 2482 extending and bending downwards from two corners of the extension part 248, respectively locking with the protruding parts 2213, 2223 on holding parts 2211, 2221 of the first and the second metal locking member 221, 222. On the other end of the main body 240, corresponding to the extension part 248, an elastic projecting part 249 is disposed thereof. A recess 2491 is disposed on center of the front end of the elastic projecting part 249 to provide space for the pressing part 262 of the lever 26. A third and a fourth hook 2493, 2494 are disposed on two ends of the front end of the elastic projecting part 249, extending downwards. The third and the fourth hooks 2493, 2494 assemble with the holding parts 2232, 2242 of the third metal locking member 223 and the fourth metal locking member 224 so as to lock and fix the other end of the pick-up cap 24.

The pick-up cap 24 is fastened and locked by the four metal locking members so that the pick-up cap can still be assembled even there is a little modification on structure of the pick-up cap. Thus the design and development cost are reduced, and such kind of pick-up cap is more universal. Moreover, the metal locking members can also be integrated with and extended from the metal frame, or one end of the pick-up cap is locked on two metal locking members of one end of the insulated body while the other end of the pick-up cap is locked on the structure other than the metal clip such as the insulated body, the fastening seat that is a metal frame, the lever, and the pivoting axis of the lever. Such kind of modifications shall all fall inside scope of the present invention.

Referring from FIG. 20 to FIG. 23, an electrical connector 3 of the present invention also includes a main body, a metal clip 35 assembled with the main body and a lever 36 for fastening the metal clip 35. The difference between this embodiment and above three embodiments (one to three) is that the main body does not possess a fastening seat but a metal frame. Instead, four metal locking members are arranged on edge of an insulated body 30 of the main body. The difference between this embodiment and the fourth embodiment is that the pick-up cap 34 is not locked on the metal locking member but on the insulated body 30.

A receiving part 301 for loading a chip module (not shown in figure) with a plurality of terminal holes 3011 for receiving conductive terminals 3012 is disposed on the insulated body 30. Two projecting parts 302 with a recess 2303 for receiving locking members are respectively arranged on two ends of the insulated body 30. A fastening hole 3031 is arranged on middle part of the recess 303 of the projecting part 302 so that the fastening members 13 fastens the metal locking members on the insulated body 30 and the electrical connector on a circuit board (not shown in figure). Moreover, two first locking holes 3021 and two second locking holes 3022 are mounted on the projecting part 302 while a step-like part 3023 is set inside the first locking hole 3021 and the second locking hole 3022 for locking and holding the pick-up cap 34.

A pick-up cap 34 includes a main body 340 that is a closed flat surface for adsorption of a vacuum nozzle; a rectangular through hole 345 is welded outside of the main body 340 for heat dissipation while being welded. Two second hooks 342 extending and bending downwards from one end of the main body 340 are assembled with the step-like parts 3023 in the two second locking holes 3022 of the insulated body 30 so as to locking and holding one end of the pick-up cap 34. On the other end of the main body 340, a recess 343 is disposed on center of the front end of that end to provide space for the pressing part of a lever 36. Two first hooks 341 extending downwards from two sides of the end of the recess 343 are assembled with the step-like parts 3023 in the two first locking holes 3021 of the insulated body 30 for locking and fastening the other end of the pick-up cap 34. Furthermore, a plurality of locking pieces 345 is arranged on two ends and two sides of the main body 340 so as to locate and fix the pick-up cap 34 on the electrical connector 3.

A third and a fourth hook 2493, 2494 are disposed on two ends of the front end of the elastic projecting part 249, extending downwards. The third and the fourth hooks 2493, 2494 assemble with the holding parts 2232, 2242 of the third metal locking member 223 and the fourth metal locking member 224, so as to lock and fix the other end of the pick-up cap 24.

Other components of the electrical connector 3 are the same with the electrical connector 2.

The pick-up cap 34 is locked and fastened on the insulated body 30 so that even there is a little modification on structure of the metal clip, the pick-up cap can still be used. Thus the design and development cost are reduced, and such kind of pick-up cap is more universal. Moreover, only one end of the pick-up cap is locked on the insulated body while the other end of the pick up cap is locked on the structure other than the metal clip such as the metal locking member, the lever, and the pivoting axis of the lever.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. An electrical connector assembly for connecting a chip module on circuit boards comprising an electrical connector and a pick-up cap assembled on the electrical connector; the electrical connector having a main body and a metal clip; the main body comprising an insulated body and a plurality of terminals electrically connected with the chip module and mounted inside the insulated body, the metal clip assembled with the main body for pressing the chip module on the terminal, wherein the pick-up cap is attached to the main body and is above the metal clip.

2. The electrical connector assembly as claimed in claim 1, wherein a smooth surface is arranged on center of the pick-up cap for adsorption of a vacuum nozzle.

3. The electrical connector assembly as claimed in claim 1, wherein at least one end of the pick-up cap is locked on hooks of the main body.

4. The electrical connector assembly as claimed in claim 1, wherein at least one reinforcing rib is extending downwards from a main body of the pick-up cap.

5. The electrical connector assembly as claimed in claim 1, wherein the pick-up cap is closed.

6. The electrical connector assembly as claimed in claim 1, wherein the pick-up cap is disposed on the insulated body.

7. The electrical connector assembly as claimed in claim 6, wherein locking holes for fastening the pick-up cap are mounted on the insulated body while a step-like part is arranged inside the locking hole.

8. The electrical connector assembly as claimed in claim 7, wherein the pick-up cap comprising a main body, and hooks for assembling with the step-like part in the locking hole of the insulated body extend and bend downwards from two sides of an end part of bottom surface of the main body.

9. The electrical connector assembly as claimed in claim 8, wherein locking pieces for locating and fixing the pick-up cap on the electrical connector are arranged on both ends and sides of the main body of the pick-up cap.

10. The electrical connector assembly as claimed in claim 1, wherein the main body further comprises a lever for fastening the metal clip, both the lever and the metal clip are arranged respectively on two ends of the insulated body, and the lever having a pivot axis defining a pressing part for pressing free end of the metal clip on middle part thereof.

11. The electrical connector assembly as claimed in claim 10, wherein one end of the pick-up cap is assembled with the pivot axis of the lever.

12. The electrical connector assembly as claimed in claim 11, wherein the pick-up cap comprises a main body of the pick-up cap and two first hooks extend in opposite direction from two sides of one end of the main body of the pick-up cap while two second hooks extend downwards and outwards from the main body of the pick-up cap corresponding to the first hooks; a second hooking part is disposed on rear end of the second hook and is fixed with outer end of two pivoting parts of the pivot axis of the lever.

13. The electrical connector assembly as claimed in claim 1, wherein the main body further comprises four metal locking members on two ends of the insulated body and the pick-up cap is locked with the four metal locking members.

14. The electrical connector assembly as claimed in claim 13, wherein the four metal locking members are four pieces of independent metal defining a first metal locking member and a second metal locking member on one end of the insulated body with similar structure, a third metal locking member and a fourth metal locking member on the other end of the insulated body with similar structure.

15. The electrical connector assembly as claimed in claim 14, wherein the pick-up cap comprises a main body and an extension part whose width is smaller than that of the main body, the extension part is arranged on one end of the main body; a first hook and a second hook extending and bending downwards are arranged vertically on two sides of an end of the extension part, respectively locking with the first and the second metal locking members for fastening and locking one end of the pick-up cap; on the other end of the main body, corresponding to the extension part, an elastic projecting part is disposed thereof, while a third hook and a fourth hook extending downwards are disposed on two ends of a front part of the elastic projecting part for assembling with the third metal locking member and the fourth metal locking member, so as to lock and fix the other end of the pick-up cap.

16. The electrical connector assembly as claimed in claim 1, wherein the main body further comprises two metal locking members located on one end of the insulated body, one end of the pick-up cap is fastened and locked with the two metal locking members.

17. The electrical connector assembly as claimed in claim 16, wherein each of the metal locking members is formed by an independent metal piece.

18. The electrical connector assembly as claimed in claim 16, wherein the main body further comprises a metal frame and the metal locking member is located on the metal frame.

19. The electrical connector assembly as claimed in claim 16, wherein the pick-up cap further comprises a main body, while the width of an extension part is smaller than that of the main body and the extension part is arranged on one end of the main body, a first hook and a second hook extending and bending downwards are disposed vertically on two sides of an end part of the extension part, respectively locking with the two metal locking members for fixing one end of the pick-up cap.

* * * * *

UNITED STATES PATENT AND TRADEMARK OFFICE
CERTIFICATE OF CORRECTION

PATENT NO.       : 7,404,721 B2
APPLICATION NO.  : 11/641866
DATED            : July 29, 2008
INVENTOR(S)      : Ju et al.

Page 1 of 1

It is certified that error appears in the above-identified patent and that said Letters Patent is hereby corrected as shown below:

Column 3, line 52, after "metal clip 15." Insert --The pick-up cap is attached to the insulating body 10 without any intermediate attachment.--.

Column 7, line 2, delete "wherein the pick-up cap is attached to the main body" and replace with --wherein the pick-up cap is attached directly to the main body without any intermediate attachments--.

Signed and Sealed this

Eighth Day of September, 2009

David J. Kappos
*Director of the United States Patent and Trademark Office*